United States Patent [19]

Mills

[11] Patent Number: 4,983,972
[45] Date of Patent: Jan. 8, 1991

[54] VIDEO DELTA MODULATION ENCODER

[75] Inventor: George T. Mills, Ridgecrest, Calif.

[73] Assignee: The United States of America as represented by the Secretary of the Navy, Washington, D.C.

[21] Appl. No.: 422,315

[22] Filed: Oct. 13, 1989

[51] Int. Cl.$^5$ .............................................. H03M 3/02
[52] U.S. Cl. ....................................... 341/143; 341/168
[58] Field of Search ................. 341/143, 166, 167, 168

[56] References Cited

U.S. PATENT DOCUMENTS

| | | | |
|---|---|---|---|
| 3,878,465 | 4/1975 | Stephenne et al. | 341/143 |
| 3,925,731 | 12/1975 | Brianard et al. | 341/143 |
| 4,042,921 | 8/1977 | Smith | 341/143 |
| 4,301,446 | 11/1981 | Petit | 341/143 |
| 4,462,106 | 7/1984 | De Freitas et al. | 341/143 |

OTHER PUBLICATIONS

Fink, Donald and Christiansen, Donald, Editors; "Delta Modulation" (DM), Electronics Engineers Handbook, Third Edition 1989 with material from Second Edition 1982, McGraw-Hill, N.Y., pp. 14-39 through 14-43.
Jones, Don; "Delta Modulation for Voice Transmission", Harris Analog Product Data Book, 1986, App. note 607, pp. 10-227 through 10-230.

Primary Examiner—William M. Shoop, Jr.
Assistant Examiner—Marc S. Hoff
Attorney, Agent, or Firm—Sol Sheinbein; Melvin J. Sliwka; Stephen J. Church

[57] ABSTRACT

In a continuously variable slope delta modulation encoder or decoder, the slope of a reconstructed signal is varied by selecting the charging voltage across an integrating capacitor. For an NTSC video signal, the charging voltage may be selected by a shift register connected to a voltage divider supplying the integrating capacitor.

11 Claims, 2 Drawing Sheets

VIDEO DELTA MODULATION ENCODER

BACKGROUND OF THE INVENTION

1. Field of the Invention

The present invention pertains to the field of pulse modulators and demodulators using the delta modulation system.

2. Description of the Related Art

Delta modulation, a one bit pulse-code modulation scheme for digitizing an analog signal, and the National Television Standards Committee (NTSC) video signal are well-known and will be briefly reviewed as background for the present invention. In Delta modulation each bit represents the desired instantaneous slope of a signal which is the integrated encoded signal and corresponds to the input analog signal. Typically, a "one" of the encoded signal represents a positive slope and a "zero" represents a negative slope. In a delta modulation encoder or modulator, the modulated output signal is provided to an integrating circuit whose output is compared at each bit time to the input analog signal to determine the next output bit of a non-return- to-zero (NRZ) modulated signal. A basic delta modulation encoder consists of a flip-flop to generate the bits at times determined by any suitable clock signal, a RC circuit having a time constant much longer than each bit time to perform the integration, and a comparator receiving the analog signal and the integrating circuit output. The comparator output is arranged to set or reset the flip-flop so that the resulting slope of the integrated signal is in a direction to correct any difference between the integrated signal and the input signal. A delta modulation decoder or demodulator receives the modulated signal and any necessary clock signal and consists only of an integrating circuit which is substantially identical to that of the encoder and thus reconstructs the original analog signal. In telemetry the clock signal may be provided at the decoder in a well- known manner by a phase locked circuit controlled by transitions in the modulated signal.

As the NRZ delta modulated signal is integrated, the integrated signal will always have a slope or slew rate determined by the integrator time constant. As a result, a constant analog signal to the encoder is represented by alternate ones and zeroes in the modulated signal and by segments of the reconstructed signal alternating upwardly and downwardly by such slope. However, it is apparent that an original analog signal having variations corresponding to lesser changes than the changes in such an encoded constant signal will also be decoded as a constant; this is termed "quantizing error". It is also apparent that, conversely, an original signal having variations greater than such slope cannot be followed by the integrator; this condition is termed "slope overload". These limitations of delta modulation may be alleviated by increasing the bit rate, but the bit rate cannot, of course, be increased arbitrarily and without limit.

As a result, it is well-known to provide arrangements for delta modulation in which such slope is varied by changing the time constant of the integrating RC circuit in some manner so that such slope is low to minimize quantizing error when alternate ones and zeroes in the modulated signal indicate the encoder is following the input signal and so that such slope is increased when successive ones or zeroes in the modulated signal indicate the signal represented by the encoder output is lagging the input signal. Such arrangements and modulation are thus referred to herein as "multi-slope delta modulation" or, since the slope may change each bit time, as "continuously variable slope delta modulation". Such delta modulation is also termed "high information delta modulation" or "adaptive delta modulation". It is well-known to use two or more such slopes selected by appropriate logic based on the values of successive bits.

Delta modulation is used extensively for voice transmission, where limited changes in amplitude at high voice frequencies minimize problems with quantizing error and slope overload. However, delta modulation has not been extensively applied to the NTSC video signal where quantizing error results in excessive "smearing" of the reproduced image in near identical gray areas, which are common in industrial and telemetered video images for reasons such as low light level, and where slope overload results from a rapid change in the signal at a white to black or black to white border or at the end of a video line when there is a transition between the maximum white level to the minimum or "sync" level. However, in comparison to other modulation schemes, very few elements using little power are required in a modulator or encoder for delta modulation so that delta modulation is highly desirable for certain telemetry applications where the telemetry transmitting elements must be compact, be light in weight, require low power, and be expendable. However, in these applications a great deal of other data must be telemetered in addition to a NTSC signal so that these constraints also limit the bandwidth and bit rate available for the NTSC signal.

A multi-slope delta modulation encoder representative of the prior art is shown in FIG. 1 and has an input 10 for an NTSC video signal to be encoded and has an output 11 for the encoded delta modulation signal. Elements and connections used with the encoder to provide a positive supply voltage, ground connections, and clock pulses are believed readily apparent to one skilled in the art and are omitted for clarity. The encoder has any suitable comparator 15 having a positive input 16, a negative input 17, and an output 18. Comparator 15 functions in a well-known manner to provide a positive level at output 18 when input 16 is at a relatively higher level than input 17 and to provide a negative level at output 18 when input 16 is at a relatively lower level than input 17. Encoder input 10 is connected to comparator input 16 through a 2 uf capacitor 19, a 75 ohm termination resistor 21 for the NTSC signal being connected between input 10 and ground. Any suitable voltage divider 22 is connected at comparator input 13 to center the signal thereat in the dynamic range of comparator 15. Comparator 15 may be a Linear Technology LT1016 comparator having a nominal delay time of 10 nsec for following the NTSC signal, divider 22 then consisting of a 4.42 Kohm resistor 23 connected between input 13 and a 5 volt source and of a 4.02 Kohm resistor 24 connected between this input and ground.

The encoder has a flip-flop 30 having an input 31 connected to comparator output a clock input 32, and an output 33 connected to encoder output 11 and set or reset to correspond to the output 18 level when a clock pulse is provided to input 32. The encoder has an integrating capacitor 35 having one side connected to ground and the other side connected to comparator input 17 by a conductor 37. The encoder has three resistors 41, 42, and 43 connected in parallel between output 11 and conductor 37. Resistor 41 is permanently connected between output 11 and conductor 37, and resistors 42 and 43 are connected therebetween through respective solid state switches 45 and 46.

The encoder has a pair of flip-flops 50 and 51 which are similar to flip-flop 30 and receive the same clock signal. The input of flip-flop 50 is connected to encoder output 11 so as to receive the current bit level thereon, and the input of flip-flop 51 is connected to the output of flip-flop 50. Flip-flop 50 thus retains the level of the bit provided by the encoder previous to the current bit while flip-flop 51 retains the level of the bit preceding such previous bit. The encoder has any suitable switch logic circuit 55 which, functionally, has a first exclusive-or gate 56 receiving the current bit output 11 and the previous bit output from flip-flop 50 and has a second exclusive-or gate 57 receiving the previous two bit output levels from flip-flops 50 and 51. The output of gate 56 controls switch 45 and is provided, together with the output from gate 57, to an AND gate 58 which controls switch 46.

It is evident from the connections of flip-flops 50 and 51 and circuit 55 that, when the current bit and the previous two bits output by the encoder are the same, switches 45 and 46 are closed and capacitor 35 charges rapidly through an equivalent resistance of 250 ohms to provide a steep slope for the signal on output 11. However, when the current and immediately previous bits are the same but different from the other retained bit, only switch 45 is closed and the capacitor charges through an equivalent resistance of 500 ohms to provide an intermediate slope. For other bit patterns, switches 45 and 46 are open so that the capacitor charges only through the 750 ohm resistor 41 to provide a minimum slope for the encoder output signal. It is apparent that, by selection of different resistances for resistors 41–43 and different arrangements of logic elements such as those of circuit 55, the signal on output 11 may have other slopes corresponding to other desired patterns of successive bits of this signal.

While an encoder such as that of FIG. 1 is effective as a multi-slope delta modulation encoder and is simpler than modulators for other forms of modulation, such an encoder has a number of elements, particularly the solid state switches and logic elements of circuit 55, which are relatively bulky and heavy, consume power, increase cost, and complicate circuit layout and construction.

SUMMARY OF THE INVENTION

In an integrating circuit for a multi-slope delta modulation encoder or decoder, the charging voltage across an integrating capacitor is selected to vary the slope of a reconstructed signal which, in an encoder, is compared with the input signal to determine the next bit of the encoded signal. For use with an NTSC video signal, the charging voltage is, preferably, selected by a shift register receiving the encoded signal and retaining the current and immediately previous bits thereof. The shift register terminals corresponding to the retained bits serve selectively as sources or sinks for a voltage divider through which the integrating capacitor charges to integrate the encoded signal.

An object of the present invention is to provide a compact and light weight multi-slope delta modulation encoder requiring low power.

Another object is to provide such an encoder receiving a NTSC video signal and generating a serial digital signal providing satisfactory video reproduction with relatively low data rates.

A further object is to provide such an encoder which uses a minimal number of readily available parts.

BRIEF DESCRIPTION OF THE DRAWINGS

These and other objects, advantages, and novel features of the present invention will become apparent from the following detailed description when considered with the accompanying drawings in which.

DESCRIPTION OF THE PREFERRED EMBODIMENT

Figures 1, 2:
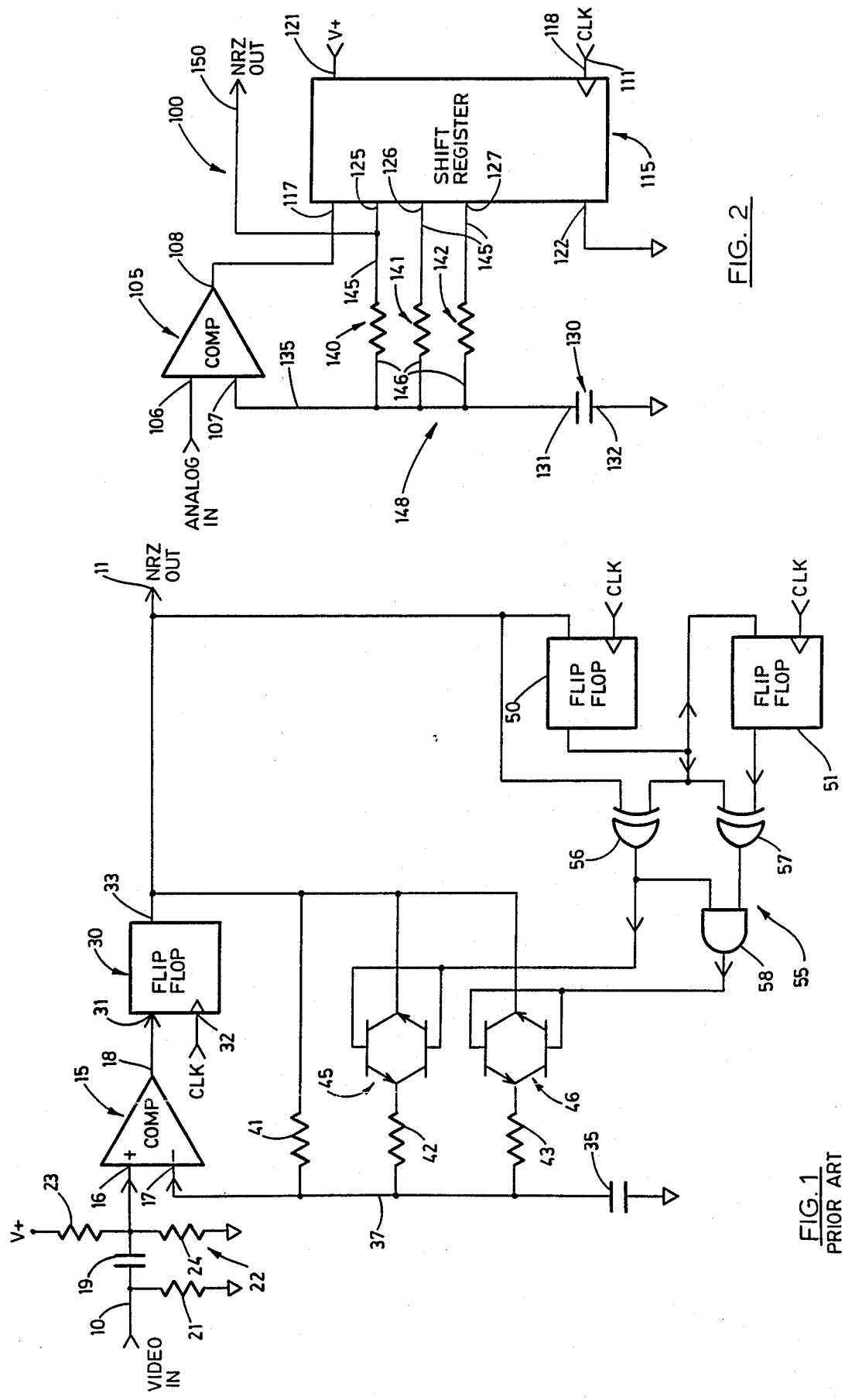
FIG. 1 is a block diagram of a prior art multi-slope delta modulation encoder.
FIG. 2 is a block diagram of a multi-slope delta modulation encoder embodying the present invention.

A delta modulation encoder embodying a multislope integrating circuit 100 of the present invention is depicted in FIG. 2. As in the encoder of FIG. 1, elements and connections to provide a positive supply or source voltage, ground or voltage sink connections, and clock pulses are believed readily apparent to one skilled in the art and are omitted for clarity.

The encoder of FIG. 2 has a comparator 105 having a first input 106 for an analog signal input to the encoder for modulation thereby, a second input 107, and an output 108. When the encoder is used with an NTSC video signal, comparator 105 may be substantially identical to comparator 15 and have substantially identical signal conditioning and termination resistors and a capacitor. Comparator 105 functions similarly to comparator 15 to provide on output 108 a comparison signal to circuit 100, this signal representing the value of successive bits of a variable slope delta modulated output signal of the encoder. The signal on output 108 is not, however, such an output signal since it does not necessarily change, as required, at bit time periods defined by a succession of clock pulses on a clock signal input 111 to the encoder. The only other active element of circuit 100 is any suitable shift register 115 in which subsequently identified individual bit connections or outputs are substantially equally effective as both sources and as sinks at the working voltage and current levels and in which the propagation delay is not too long for the frequency of the clock signal 111. In an integrating circuit of the present invention for use with an NTSC video signal, an RCA CD54/74ACT164 8-bit serial-in/parallel-out shift register has been found effective with clock frequencies in the range of 6–25 MHz. Shift register 115 has a serial input connection 117 connected to comparator output 108 and receiving the signal thereon and has a clock connection 118 connected to clock input 111 and receiving the signal thereon. The shift register has a positive or first voltage supply connection 121 and a ground or second voltage connection 122 which are, respectively, the ultimate source and sink for such individual bit connections of the register. These connections, which are some times referred to in the claims as "terminals" or "register output connections" are a first bit connection 125, a second bit connection 126, and a third bit connection 127. A shift register, such as register 115, used in the practice of the present invention may have additional such bit connections, not shown. It will be subsequently apparent that other embodiments of the present invention may use more than three or only two shift register bit connections.

Register 115 functions in a well-known manner to retain the binary values or logic levels of three successive levels of the signal at input 117 at three corresponding successive bit periods defined by the signal at input 118. The value or binary level of the bit most recently provided as the comparison signal at comparator output 108 to input 117 is retained by register 115 and is provided at bit connection 125 thereof; the value of the bit immediately previous to such most recent bit is provided at connection 126; and the value of the bit before such immediately previous bit is provided at connection 127. Each connection 125-127 provides a source at the voltage of connection 121 when the corresponding bit has one binary value and provides a sink at the voltage of connection 122 when this bit has the other binary value. Any additional bit connections of register 115 similarly provide the value of the comparison signal at even earlier bit periods.

Register 115 is thus receptive to the comparison signal at input 117 and to the clock pulses on input 118 to provide at connection 125 a voltage source when the comparison signal has one binary level at one of said clock pulses and to provide at connection 125 a voltage sink when the comparison signal has the other binary level at one of said clock pulses. Register 115 is similarly receptive to provide at connection 126 a voltage source when the comparison signal has one binary level at such a clock pulse preceding the one clock pulse and for providing at connection 126 a voltage sink when said comparison signal has the other binary level at such a clock pulse preceding the one clock pulse.

Circuit 100 has an integrating capacitor 130 having a pair of electrically opposite terminals 131 and 132. Terminal 131 is an integrated signal connection for the capacitor. Terminal 132 is a ground connection for the capacitor and is connected to the same voltage sink as register connection 122. Circuit 100 has an integrated signal conductor 135 which connects capacitor terminal 131 to second comparator input 107. Terminal 131 thus provides a subsequently described integrated signal thereon to comparator input 107 of comparator 105 so that the comparator generates the comparison signal which is on output 108 and represents the level of the analog signal on input 106 in relation to the integrated signal on input 107.

Circuit 100 has a first voltage divider resistor 140, a second voltage divider resistor 141, and a third voltage divider resistor 142, each having a first terminal 145 and an electrically opposite second terminal 146. Each terminal 146 which is directly connected to integrated signal conductor 135 and is thus directly connected to integrated signal terminal 131 of capacitor 130. Resistors 140-142 have their terminals 145 directly connected, respectively, to register connections 125-127, so that resistors 140-142 correspond individually to connections 125-127. It can be seen that these resistors are connected in parallel between shift register 115 and capacitor terminal 131 and that these resistors define a voltage divider, which is indicated generally by numeral 148, between the voltages of register connections 121 and 122.

Circuit 100 has an output terminal 150 connected to bit output 125 of register 115 at a point between this output and first resistor 140 to provide the voltage at this output as the succession of bits which are the NRZ variable slope delta modulated output signal generated by the encoder of FIG. 2. Register 115 thus outputs in succession at connection 125 the voltages corresponding to the values of successive bits of the modulated signal. To preclude excessive loading of a bit output, such as one of the outputs 125-127 connected to a resistor such as resistors 140-142, by an output terminal such as terminal 150, the output terminal may be connected to one of the before-mentioned additional bit outputs of the register to provide a somewhat delayed signal substantially interchangeable with that from connection 125.

OPERATION

The operation of an embodiment of the present invention is believed clearly apparent and will now be briefly described. In such an embodiment, voltage divider 148 serves to charge capacitor 130 at a plurality of charging rates individually corresponding to a plurality of charging voltages predetermined by the resistances of resistors 140-142 and individually corresponding to desired patterns of the three most recent bits of the modulated signal on terminal 150 as retained by shift register 115 and provided to the resistors by register outputs 125-127. These resistances are selected so that such charging rates correspond individually to a plurality of desired variable slopes of an integrated signal provided on conductor 135 by the charging of capacitor 130. When the encoder is in operation, the predetermined slopes provided by the resistors 140-142 are selected by the relative binary level of the comparison signal on comparator output 108 at the three preceding clock pulses on clock input 111. These slopes are thus selected in accordance with the corresponding bits of the modulated signal on output 150. As a result, circuit 100 provides an integrated signal characterized by slope variations corresponding to variable charging rates of capacitor 130, these rates being selected by the corresponding variations in the charging voltage applied to the capacitor.

An embodiment of the present invention, which is effective with the NTSC video signal and a clock rate of 6 MHz, uses an RCA 74ACT164 shift register with a nominal positive source voltage of 5 volts, and a nominal sink voltage sink of 0 volts. In this embodiment, capacitor 130 has a capacitance of 3300 pF and resistors 140-142 have respective resistances of 2.5, 7.5, and 7.5 Kohms to give six slopes of the integrated signal provided by circuit 100 on conductor 135. These slopes correspond to Thevenin equivalent voltages provided by voltage divider 148 in response to the eight possible patterns of three bits of the modulated signal at output 150. With these resistances and with the bit provided at register connection 125 as the most significant and that at connection 127 as the least significant, pattern "000" gives 0 volts, patterns "001" and "010" give 1 volt, pattern "011" gives 2 volts, pattern "100" gives 3 volts, patterns "101" and "110" give 4 volts, and pattern "111" gives 5 volts.

Figure 3B:
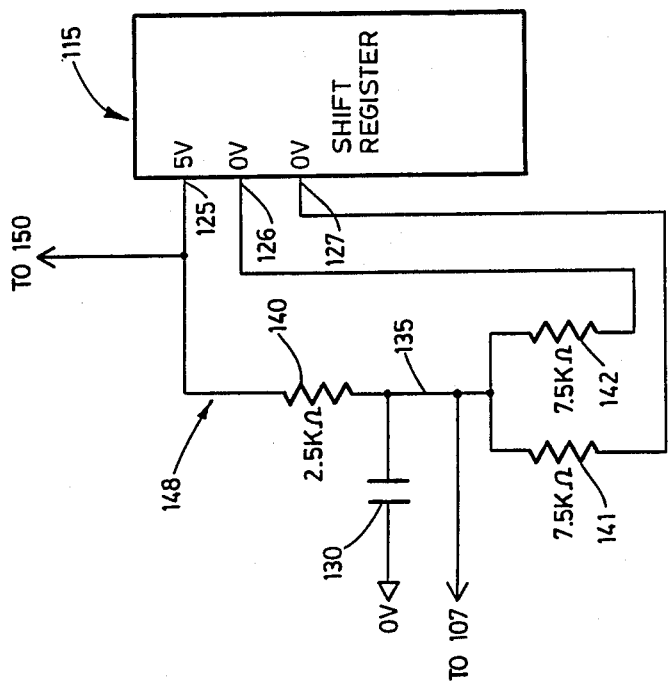
FIGS. 3A and 3B are diagrams of voltage dividers formed by the encoder of FIG. 2 when different bit patterns are encoded thereby.
Figure 3A:
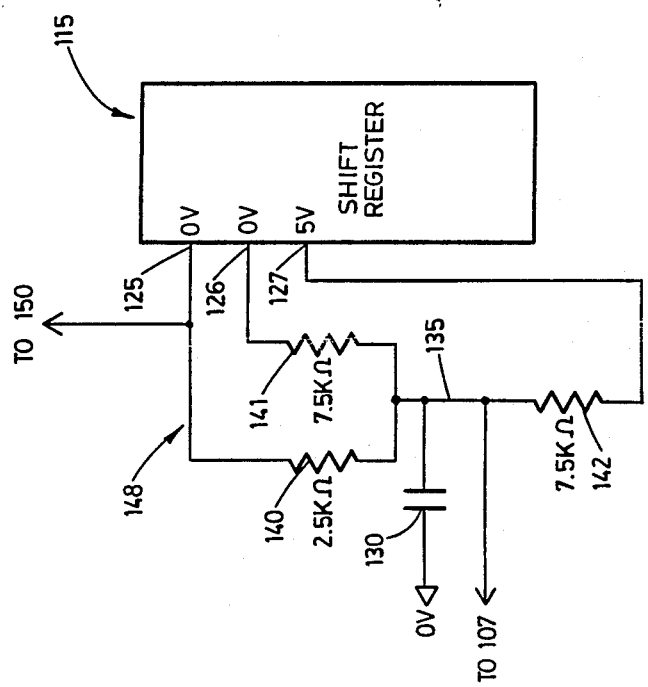

The operation of voltage divider 148 will be apparent from FIG. 3A representing such a "001" bit pattern and FIG. 3B representing such a "100" bit pattern. In FIG. 3A, register outputs 125 and 126 provide 0 volts to resistors 140 and 141 and output 127 provides 5 volts to resistor 142. Resistors 140 and 141 thus have an equivalent resistance of 1.875 Kohms in series with the 7.5 Kohms of resistor 142 so that there is a 4 volt drop through resistor 142 and 1 volt is provided at conductor 135 to charge capacitor 130. In FIG. 3B, register outputs 126 and 127 provide 0 volts to resistors 141 and 142 and output 125 provides 5 volts to resistor 140. Resistors 141 and 142 thus have an equivalent resistance of 3.75 Kohms in series with the 2.5 Kohms of resistor 140 so that there is a 2 volt drop through resistor 140 and 3 volts are provided at conductor 135 to charge capacitor 130.

It will be apparent that the principles of the present invention may be embodied in a delta modulation integrating circuit similar to circuit 100 but using only the two shift register bit outputs corresponding to first output 125 and second output 126 with elements otherwise like those described above to give, for bit patterns "00", "01", "10", and "11", integrated signal slopes corresponding to Thevenin equivalent charging voltages of 0.00, 1.25, 3.75, and 5.0 volts. Such a two slope circuit has been found effective with the NTSC video signal when a clock rate of 9–10 MHz can be used. Similarly, such a circuit similar to circuit 100 in using three shift register outputs, but with resistors corresponding to resistors 141 and 142 having respective resistances of two times and four times that of the resistor corresponding to resistor 140, will provide eight slopes corresponding to the binary weights of a three bit binary number.

Obviously, many other modifications and variations of the present invention are possible in light of the above teachings. It is, therefore, to be understood that the invention may be practiced within the scope of the following claims other than as specifically described herein.

What is claimed is:

1. In an integrating circuit for variable slope delta modulation wherein the circuit provides a plurality of slopes for an integrated signal by selection between a plurality of charging rates for an integrating capacitor, the improvement comprising said plurality of charging rates being determined by a plurality of charging voltages individually corresponding to said charging rates.

2. The integrating circuit of claim 1 wherein said charging voltages are provided by a voltage divider.

3. The integrating circuit of claim 2 wherein said integrating capacitor has a pair of electrically opposite terminals, and wherein the improvement further comprises said voltage divider having a plurality of resistors connected in parallel to one of said terminals of said integrating capacitor.

4. The integrating circuit of claim 3:
wherein the circuit is for use with a digital signal representing a succession of bits;
wherein said voltage divider has a predetermined number of said resistors and each of said resistors has a first terminal connected to said one terminal of said integrating capacitor and has an electrically opposite second terminal; and
wherein the improvement further comprises said integrating circuit having means for retaining the values of successive such bits, said retaining means having a plurality of terminals corresponding individually to said predetermined number of such successive bits and each of said terminals of said retaining means being connected to the second terminal of a corresponding one of said resistors.

5. The integrating circuit of claim 4 wherein each of said terminals of said retaining means provides a source of current at a first voltage level when the corresponding bit has a first logic value and provides a sink for current at a second voltage level when said corresponding bit has a second logic value.

6. An integrating circuit for use with an input signal representing the value of successive bits of a variable slope delta modulated output signal and with a clock signal for defining the periods of said bits, said circuit comprising:
shift register means for retaining the values of a predetermined number of successive such bits, said means having
a register input connection receiving said input signal,
said predetermined number of register output connections corresponding to said predetermined number of bits in order of succession in said modulated signal, each register output connection providing a first predetermined voltage when the corresponding bit has one value and providing a second predetermined voltage when the corresponding bit has another value, and
a clock connection receiving said clock signal
so that said shift register means outputs in succession at said register output connections such a predetermined voltage corresponding to the values of bits of said modulated signal;
an integrating capacitor having an integrated signal connection and an electrically opposite ground connection, said ground connection being connected to said second predetermined voltage; and
said predetermined number of resistors corresponding individually to said register output connections, each of said resistors being connected between the corresponding register output connection and said integrated signal connection,
so that said resistors provide, for said capacitor and in response to predetermined patterns of values of said bits of said modulated signal, a plurality of charging voltages corresponding to different desired slopes of an integrated signal at said integrated signal connection of said capacitor.

7. The integrating circuit of claim 6 wherein said circuit is for use with a comparator having a first comparator input for a signal to be modulated and has a second comparator input, and wherein said integrating circuit has an integrated signal terminal connected to said integrated signal connection for provision of said integrated signal to said second comparator input.

8. The integrating circuit of claim 6 wherein
said shift register means has a register output connection providing in succession such predetermined voltages corresponding to the values of successive bits of said modulated signal, and
said circuit has a circuit output terminal connected to said register output connection to provide the voltage thereat as said modulated signal.

9. The integrating circuit of claim 6 wherein
said shift register means has a first one of said register output connections, said first register output connection providing such a predetermined voltage representing the value of the bit of said modulated signal most recently received at said register input connection, and
said circuit has a circuit output terminal connected to said first output connection to provide the voltage thereat as said modulated signal.

10. An encoder for variable slope delta modulation of an analog signal in response to a succession of clock pulses, said encoder comprising:

a conductor for an integrated signal;

a comparator having an input for said analog signal, another input connected to said conductor, and an output providing a binary comparison signal representing the relative level of said analog signal and said integrated signal;

a plurality of resistors each having a connection to said conductor;

means, receptive to said comparison signal and to said clock pulses and having a first bit output connected to said conductor through a first one of said resistors, for providing at said first bit output a voltage source when said comparison signal has one binary level at one of said clock pulses and for providing at said first bit output a voltage sink when said comparison signal has the other binary level at one of said clock pulses;

means, receptive to said binary signal and to said clock pulses and having a second bit output connected to said conductor through a second of said resistors, for providing at said second bit output a voltage source when said comparison signal has one binary level at such a clock pulse preceding said one clock pulse and for providing at said second bit output a voltage sink when said comparison signal has the other binary level at such a clock pulse preceding said one clock pulse; and an integrating capacitor having a connection to said conductor and an opposite connection to a voltage sink, so that said resistors define, between such a voltage source and such a voltage sink, a voltage divider providing at said conductor a variable voltage source for charging said capacitor at different rates predetermined by said resistors and dependent on the relative binary level of said comparison signal at said one clock pulse and said preceding clock pulse, whereby said charging of said capacitor at said different rates generates such an integrated signal characterized by slope variations corresponding to said rates.

11. The encoder of claim 10 wherein said first bit output has a signal representing the binary level of said comparison signal at the most recent clock pulse, and wherein the encoder further comprises output terminal means for providing the first bit output signal as an encoded variable slope delta modulation signal.

* * * * *